(12) United States Patent
Chen

(10) Patent No.: US 7,728,629 B2
(45) Date of Patent: Jun. 1, 2010

(54) BUFFER WITH INDUCTANCE-BASED CAPACITIVE-LOAD REDUCTION

(75) Inventor: Jinghong Chen, Basking Ridge, NJ (US)

(73) Assignee: Agere Systems Inc., Allentown, PA (US)

( * ) Notice: Subject to any disclaimer, the term of this patent is extended or adjusted under 35 U.S.C. 154(b) by 249 days.

(21) Appl. No.: 11/526,306

(22) Filed: Sep. 25, 2006

(65) Prior Publication Data

US 2008/0074149 A1    Mar. 27, 2008

(51) Int. Cl.
*H03K 19/094* (2006.01)
(52) U.S. Cl. .............................. 326/83; 326/81; 326/88; 327/108; 327/111
(58) Field of Classification Search .................. 326/26, 326/27, 81–83, 86–87, 88, 17; 327/108–109, 327/110, 111, 333
See application file for complete search history.

(56) References Cited

U.S. PATENT DOCUMENTS

| | | | | |
|---|---|---|---|---|
| 6,175,598 | B1 * | 1/2001 | Yu et al. | 375/257 |
| 6,184,729 | B1 * | 2/2001 | Pasqualini | 327/112 |
| 6,307,417 | B1 * | 10/2001 | Proebsting | 327/277 |
| 6,617,903 | B2 * | 9/2003 | Kawamura | 327/261 |
| 7,015,720 | B2 * | 3/2006 | Schrom et al. | 326/82 |
| 7,098,703 | B2 * | 8/2006 | Harvey | 327/111 |
| 7,339,963 | B2 * | 3/2008 | Bozso et al. | 372/38.02 |

OTHER PUBLICATIONS

Apinunt Thanachayanont, CMOS Transistor-Only Active Inductor for IF/RF Applications, Dec. 2002, IEEE ICIT'02, p. 1212 Fig. 2.*
Apinunt Thanachayanont, CMOS Tansistor Only Active Inductor for IF/RF Applications, Dec. 2002, IEEE ICIT'02, p. 1212 Fig. 2.*
Apinunt Thanachayanont, CMOS Transistor Only Active Indcutor for IF/RF Applications, Dec. 2002, IEEEE ICIT'02, p. 1212 Fig. 2.*
"CMOS Digital Integrated Circuits Analysis and Design," by Sung-Mo Kang and Yusuf Leblebigi, Second Edition, Chapter 8, pp. 251-253.

(Continued)

*Primary Examiner*—James H. Cho
*Assistant Examiner*—Christopher Lo
(74) *Attorney, Agent, or Firm*—Mendelsohn, Drucker & Assoc., P.C.; Kevin M. Drucker; Steve Mendelsohn

(57) ABSTRACT

A buffer circuit uses (e.g., active) inductors for driving capacitive loads. In one embodiment, the buffer circuit has one or more stages, each stage having one CMOS inverter. Each CMOS inverter has one NMOS transistor and one PMOS transistor and is coupled to a stage input and a stage output. Additionally, at least one stage of the buffer circuit has two inductors, each coupled between a different voltage reference for the buffer circuit and the stage output. One inductor has a PMOS transistor coupled to the gate of an NMOS transistor and the other inductor has an NMOS transistor coupled to the gate of a PMOS transistor. When driving capacitive loads, the inductors partially tune out the apparent load capacitance $C_L$, thereby improving the charging capabilities of inverter and enabling quicker charge and discharge times. Furthermore, partially tuning out apparent load capacitance facilitates the driving of larger capacitive loads.

43 Claims, 4 Drawing Sheets

OTHER PUBLICATIONS

"Digital Integrated Circuits, A Design Perspective," by Jan M. Rabaey, Prentice Hall Electronics and VLSI Series, Chapter 8, pp. 450-451.

"CMOS Transistor-Only Active Inductor For IF/RF Applications," by Apinunt Thanachayanont; IEEE ICIT'02, Bangkok, Thailand, pp. 1209-1212.

* cited by examiner

US 7,728,629 B2

BUFFER WITH INDUCTANCE-BASED CAPACITIVE-LOAD REDUCTION

BACKGROUND OF THE INVENTION

1. Field of the Invention

The present invention relates to electronic circuits, and more specifically to buffer circuits used for driving capacitive loads.

2. Description of the Related Art

In integrated circuits, CMOS inverters are often used as buffers to drive on-chip and off-chip capacitive loads. Typically, a single-stage buffer comprising one inverter is not sufficient to drive capacitive loads that are excessively large, so a series of gradually scaled-up stages are configured together to create a "super buffer." While super buffers are effective in driving large capacitive loads, they are relatively complex and consequently they consume a significant amount of chip area. The teachings of Kang, et al., "CMOS Digital Integrated Circuits," and Rabaey, "Digital Integrated Circuits," both of which are herein incorporated by reference, discuss the operability of the super buffer design.

SUMMARY OF THE INVENTION

In one embodiment, the present invention is an apparatus that is or comprises an integrated circuit comprising a buffer having one or more buffer stages connected in series. The at least one buffer stage comprises a stage input node adapted to receive a stage input signal, a stage output node adapted to present a stage output signal, buffer circuitry connected between the stage input node and the stage output node, and at least one inductor connected between the stage output node and a voltage reference node for the buffer stage, such that the at least one inductor is adapted to reduce apparent load capacitance of circuitry connected to the stage output node.

BRIEF DESCRIPTION OF THE DRAWINGS

Other aspects, features, and advantages of the present invention will become more fully apparent from the following detailed description, the appended claims, and the accompanying drawings in which like reference numerals identify similar or identical elements.

DETAILED DESCRIPTION

Figure 1:
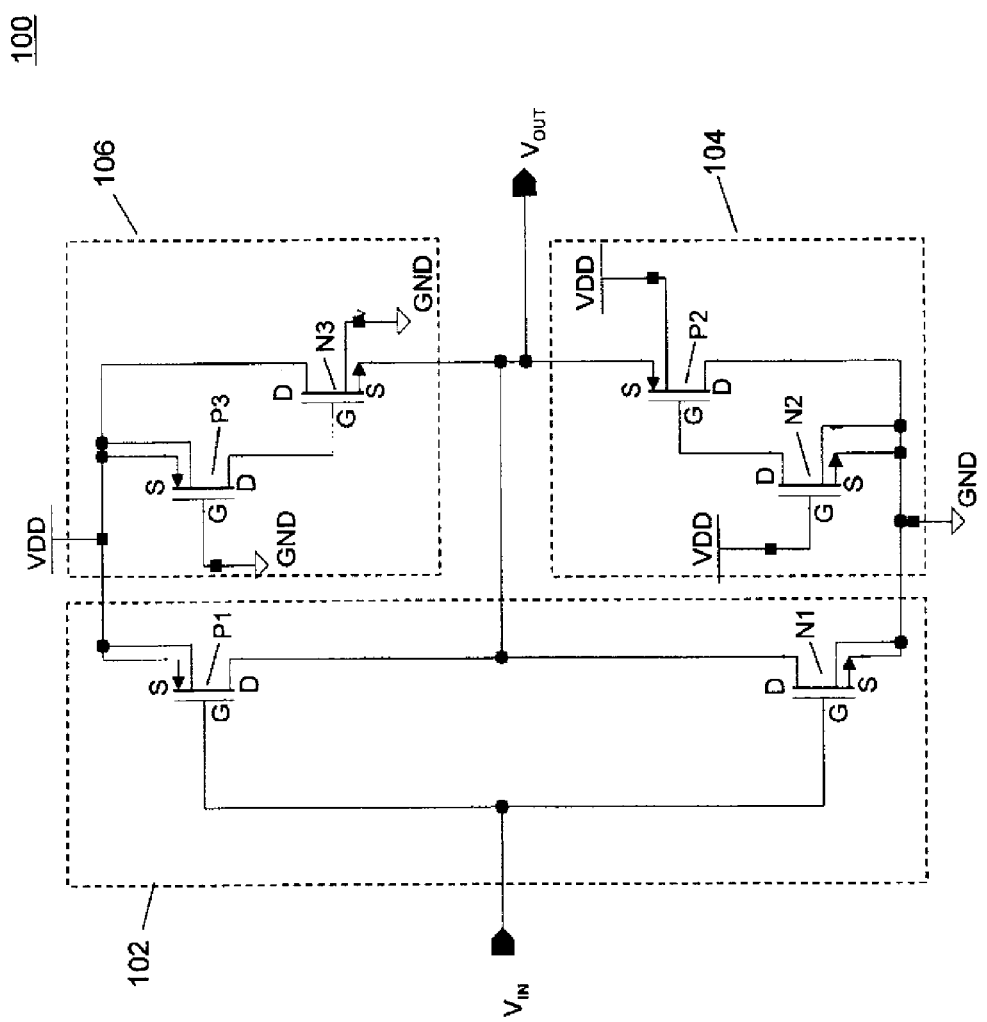
FIG. 1 shows a schematic diagram of a single-stage CMOS buffer with active inductors according to one embodiment of the present invention.

FIG. 1 shows a schematic diagram of a single-stage CMOS buffer 100 according to one embodiment of the present invention. Buffer 100 receives input signal $V_{IN}$ and generates inverted output signal $V_{OUT}$. Output signal $V_{OUT}$ drives capacitive loads located either on chip or off chip.

Buffer 100 has inverter circuitry 102, first active inductor circuitry 104, and second active inductor circuitry 106. Inverter circuitry 102 includes PMOS transistor P1 and NMOS transistor N1 and is equivalent to a prior-art CMOS inverter. Active inductor circuitry 104 includes NMOS transistor N2 and PMOS transistor P2 which together act as a first inductor. Transistor N2 of active inductor circuitry 104 operates in the triode region and thus acts as a resistor connected to the gate of transistor P2. Active inductor circuitry 106 includes PMOS transistor P3 and NMOS transistor N3 which together act as a second inductor. Like transistor N2, transistor P3 also operates in the triode region and acts as a resistor connected to the gate of transistor N3.

Figure 2:
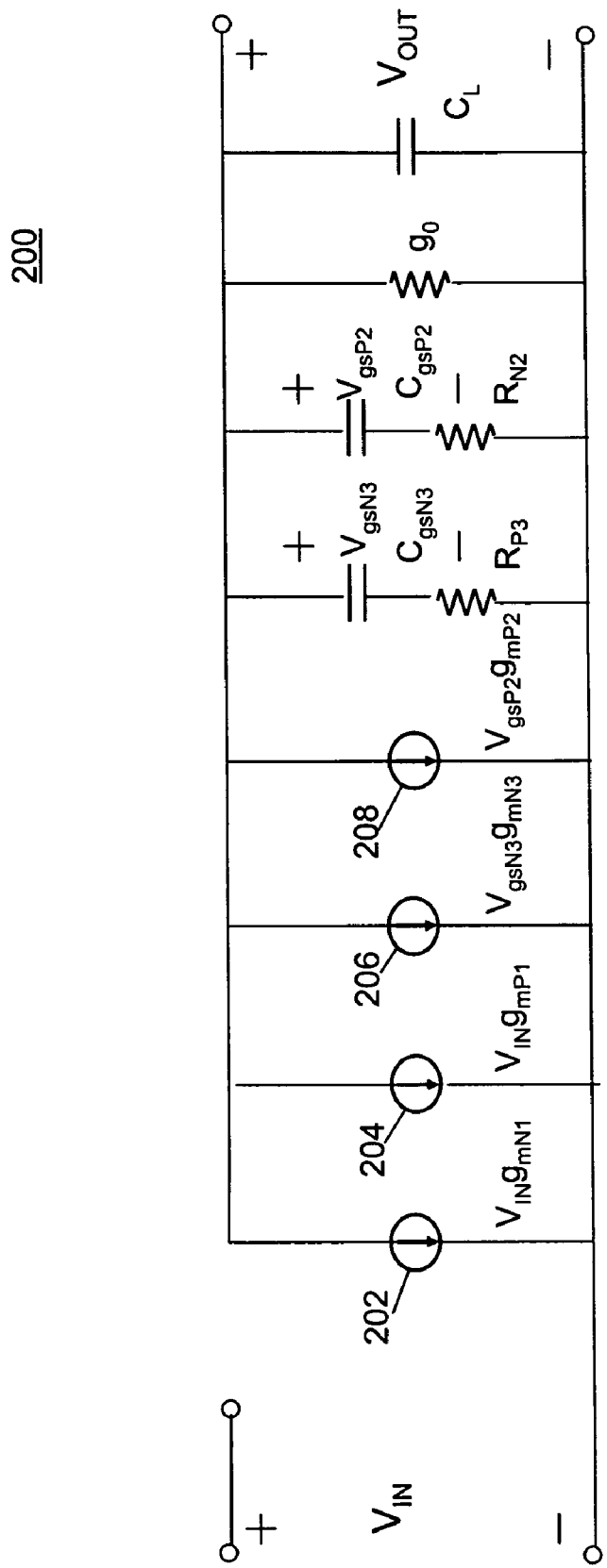
FIG. 2 shows a schematic diagram of the small-signal model of the buffer of FIG. 1.

FIG. 2 shows a schematic diagram of a small-signal model 200 of buffer 100. Small-signal model 200 has input signal $V_{IN}$ and output signal $V_{OUT}$, which represent $V_{IN}$ and $V_{OUT}$ of FIG. 1. Output signal $V_{OUT}$ drives the on-chip or off-chip capacitive load, which is represented by capacitor $C_L$.

The various elements of buffer 100 are represented in small-signal model 200. In particular, current source 202 represents the current flow through transistor N1, which is approximately input voltage $V_{IN}$ times the transconductance $g_{mN1}$ of transistor N1. Current source 204 represents the current flow through transistor P1, which is approximately input voltage $V_{IN}$ times the transconductance $g_{mP1}$ of transistor P1. Current source 206 represents the current flow through transistor N3 which is approximately the gate-to-source voltage $V_{gsN3}$ of transistor N3 times the transconductance $g_{mN3}$ of transistor N3. Current source 208 represents the current flow through transistor P2, which is approximately the gate-to-source voltage $V_{gsP2}$ of transistor P2 times the transconductance $g_{mP2}$ of transistor P2. Transconductance $g_0$ is equal to the total channel transconductance of transistors P1, N1, P2, and N3.

As shown in FIG. 1 and as described above, transistors N2 and P3 act as resistors and are connected to the gates of transistors P2 and N3, respectively. In small-signal model 200, resistor $R_{N2}$ represents the equivalent channel resistance of transistor N2. Resistor $R_{N2}$ is connected in series with capacitor $C_{gsP2}$, which is representative of the gate-to-source capacitance of transistor P2. Similarly, resistor $R_{P3}$ is representative of the channel resistance of transistor P3. Resistor $R_{P3}$ is connected in series with capacitor $C_{gsN3}$, which is representative of the gate-to-source capacitance of transistor N3.

Suppose that the properties of transistors N2 and P3 are chosen such that the values of $R_{N2}C_{gsP2}$ and $R_{P3}C_{gsN3}$ are equal and may each be represented by $RC_{gs}$. Furthermore, suppose that transistors N1 and P1 are chosen such that the transconductance $g_{mN1}$ and the transconductance $g_{mP1}$ are equal and may each be represented by $g_m$. The Laplace-domain transfer function of the small-signal model may then be characterized by equation (1) as follows:

$$\frac{V_{out}}{V_{IN}} = -\frac{\frac{2g_m}{C_L}\left(s + \frac{1}{RC_{gs}}\right)}{s^2 + s\left(\frac{g_0}{C_L} + \frac{1}{RC_{gs}}\right) + \frac{2g_m}{C_L}\frac{1}{RC_{gs}}} \quad (1)$$

$$\approx -\frac{\frac{2g_m}{C_L}\left(s + \frac{1}{RC_{gs}}\right)}{s^2 + s\frac{1}{RC_{gs}} + \frac{2g_m}{C_L}\frac{1}{RC_{gs}}}$$

From equation (1), it can be shown that a low frequency zero of the transfer function is generated by active inductor circuitry 104 and also by active inductor circuitry 106. More specifically, the low frequency zero is generated due to the series connection of the equivalent channel resistance R of transistors N2 and P3 to the corresponding gate-to-source capacitance $C_{gs}$ of transistors P2 and N3. At this low frequency zero, the impedance $Z_{IN}$ of each branch of active inductor circuitry 104 and 106 is inductive and so active inductor circuitry 104 and 106 each behave as inductors for relatively small signals. This inductance boosts the high frequency components of output signal $V_{OUT}$, thereby, compensating for the high frequency loss caused by load capacitance $C_L$. Thus the inductance of active inductor circuitry 104 and 106 partially tunes out load capacitance $C_L$. In tuning out load capacitance $C_L$, active inductor circuitry 104 and 106 both reduce the signal propagation delay of inverter 102 and, therefore, improve the charging capability of inverter 102.

Compared to a multiple-stage super buffer designed to drive a given, relatively large capacitive load, the present invention can be used to implement buffer circuitry, capable of driving the same capacitive load and based on the same transistor technology (i.e., the same transistors for N1 and P1), using fewer stages, including possibly just a single stage. Since the present invention uses fewer stages, it has the additional advantage of consuming less power than the comparable multi-stage super buffer. Moreover, buffer circuitry implemented using the present invention, which has the same number of stages and which is based on the same transistor technology as a prior-art single-stage buffer or prior-art multiple-stage super buffer is capable of 1) driving the same capacitive load as the prior-art single-stage buffer or prior-art multiple-stage super buffer at quicker charging and discharging rates (e.g., smaller signal propagation delay); and 2) driving a larger capacitive load than the prior-art single-stage buffer or prior-art multiple-stage super buffer.

Figure 3:
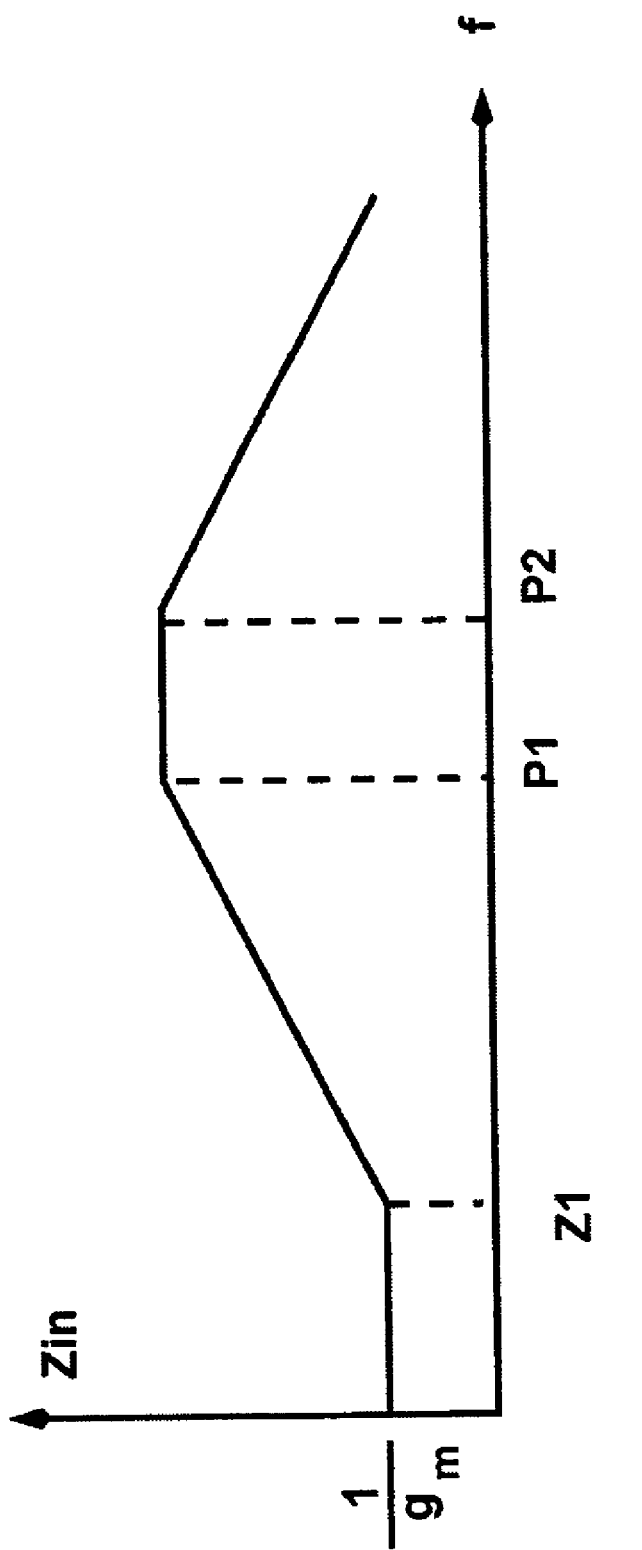
FIG. 3 shows a graphical representation of the impedance versus frequency characteristics of the CMOS buffer of FIG. 1.

FIG. 3 shows a graphical representation of the impedance $Z_{IN}$ versus frequency characteristics of each inductor 104 and 106. In addition to zero $Z_1$, the transfer function also has two poles $P_1$ and $P_2$ that result from the quadratic equation in the denominator. Poles $P_1$ and $P_2$ and zero $Z_1$ are shown in FIG. 3. As the frequency increases from zero $Z_1$ to pole $P_1$, the impedance $Z_{IN}$ also increases. The zero introduced by the active inductors alters the effect of the pole caused by $C_L$ thus extending the −3 dB bandwidth of inverter 102 to a higher frequency.

The present invention has been described using active inductors, namely active inductor circuitry 104 and 106. Compared to on-chip passive spiral inductors, active inductors use only MOS devices so they consume much smaller chip areas. In addition to chip area, on-chip spiral inductors often require excess area around the inductor to prevent interference (e.g., eddy currents) with other structures. Due to the relatively large area consumed by on-chip spiral inductors, the use of active inductors in integrated circuits is preferred over on-chip spiral inductors. Although the use of active inductors is preferred, passive inductors are not precluded from use in this invention. As such, passive inductors may be used in place of active inductors 104 and 106.

Alternative embodiments of the present invention may be envisioned, which have one or more stages. For example, in one implementation, buffer 100 may be the last stage after a series of conventional CMOS logic circuits. Buffer 100 may also be one stage linking two or more conventional CMOS logic circuits. Furthermore, multiple instances of buffer 100 may be linked together to create one multiple-stage buffer.

Further embodiments of the present invention may be envisioned, in which buffer 100 is modified to have one inductor only or more than two inductors.

Although the present invention has been described as being implemented using silicone CMOS transistor technology, the present invention can also be implemented using other transistor technologies, such as bipolar or other integrated circuit (IC) technologies such as GaAs, InP, GaN, and SiGe IC technologies.

It will be further understood that various changes in the details, materials, and arrangements of the parts which have been described and illustrated in order to explain the nature of this invention may be made by those skilled in the art without departing from the scope of the invention as expressed in the following claims. For example, PMOS transistors may be interchanged with NMOS transistors and NMOS transistors may be interchanged with PMOS transistors. Furthermore, the present invention may be implemented using buffer circuitry other than the voltage-mode static CMOS inverter 102, such as voltage-mode dynamic logic circuits, or current-mode logic (CML) circuits.

Buffers of the present invention can be implemented in a wide variety of different types of circuitry, any of which require the driving of a capacitive load. Moreover, circuits embodying buffers of the present invention can be implemented in a wide variety of applications, including any suitable consumer product or other suitable apparatus. The number and types of apparatuses in which the buffer of the present invention may be used is immeasurable.

Figure 4:
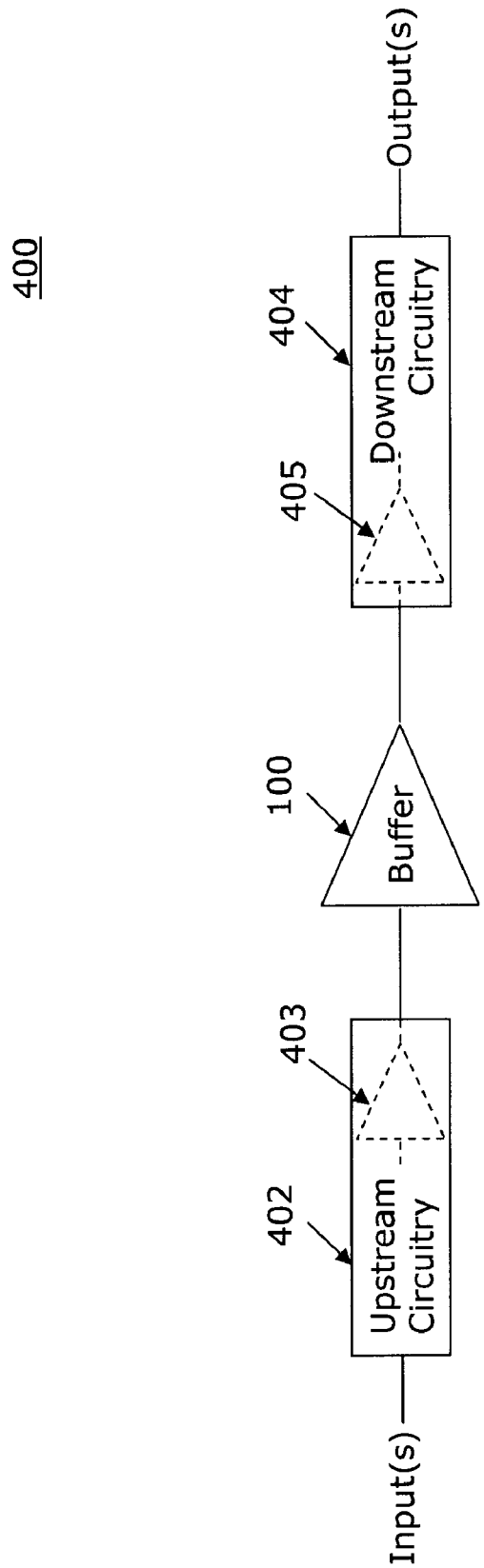
FIG. 4 shows a simplified block diagram of a representation of an apparatus 400 in which buffer 100 may be practiced.

FIG. 4 shows a simplified block diagram of a representation of an apparatus 400 in which buffer 100 may be practiced. As shown in FIG. 4, in addition to buffer 100, apparatus 400 comprises at least one of upstream circuitry 402 and downstream circuitry 404, either of which may be located on chip or off chip. For example, in one possible implementation where apparatus 400 includes microprocessor circuitry including buffer 100, upstream circuitry 402 may be any circuitry necessary to generate a clock signal. Buffer 100 may then be used to drive the clock signal to on-chip, downstream circuitry 404, which may include a plurality of on-chip circuits, each performing separate functions. As another example, upstream circuitry 402 and/or downstream circuitry 404 may comprise one or more additional buffer stages 403, 405 that are connected to buffer 100. For instance, as described above, embodiments of the present invention may be envisioned in which buffer 100 is the last stage after a series of conventional CMOS logic circuits 403. The series of conventional CMOS logic circuits 403 may be embodied in upstream circuitry 402. In other embodiments, buffer 100 may be one stage linking two or more conventional CMOS logic circuits 403, 405. The two or more conventional CMOS logic circuits 403, 405 may be embodied in upstream circuitry 402 and/or downstream circuitry 404. In yet further embodiments, multiple instances 403, 405 of buffer 100 may be linked together to create one multiple-stage buffer. The multiple instances 403, 405 of buffer 100 may be embodied in upstream circuitry 402 and/or downstream circuitry 404.

Unless explicitly stated otherwise, each numerical value and range should be interpreted as being approximate as if the word "about" or "approximately" preceded the value of the value or range.

The use of figure numbers and/or figure reference labels in the claims is intended to identify one or more possible embodiments of the claimed subject matter in order to facilitate the interpretation of the claims. Such use is not to be construed as necessarily limiting the scope of those claims to the embodiments shown in the corresponding figures.

It should be understood that the steps of the exemplary methods set forth herein are not necessarily required to be performed in the order described, and the order of the steps of such methods should be understood to be merely exemplary. Likewise, additional steps may be included in such methods, and certain steps may be omitted or combined, in methods consistent with various embodiments of the present invention.

Although the elements in the following method claims, if any, are recited in a particular sequence with corresponding labeling, unless the claim recitations otherwise imply a particular sequence for implementing some or all of those elements, those elements are not necessarily intended to be limited to being implemented in that particular sequence.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation."

I claim:

1. An apparatus comprising a buffer having one or more buffer stages connected in series, wherein at least one buffer stage comprises: a stage input node adapted to receive a stage input signal; a stage output node adapted to present a stage output signal; a buffer circuitry connected between the stage input node and the stage output node; and at least one explicit inductor connected between the stage output node and a voltage reference node for the buffer stage, such that the at least one explicit inductor is adapted to reduce apparent load capacitance of circuitry connected to the stage output node, wherein: the at least one explicit inductor is directly connected to both (1) the stage output node and (2) the voltage reference node for the at least one buffer stage, wherein the at least one explicit inductor comprises: a first inductor connected between the stage output node and a first voltage reference node; and a second inductor connected between the stage output node and a second voltage reference node.

2. The invention of claim 1, wherein the buffer circuitry is an inverter.

3. The invention of claim 2, wherein the inverter comprises:
a p-type transistor, whose gate is connected to the stage input node and whose channel is connected between the stage output node and a first voltage reference node for the buffer stage; and
an n-type transistor, whose gate is connected to the stage input node and whose channel is connected between the stage output node and a second voltage reference node for the buffer stage.

4. The invention of claim 1, wherein the buffer comprises two or more instances of the at least one buffer stage connected in series to form a multi-stage buffer circuit.

5. The invention of claim 1, wherein the buffer comprises one or more instances of the buffer circuitry connected in series with the at least one buffer stage to form a multi-stage buffer circuit.

6. The invention of claim 1, wherein the at least one inductor comprises:
a first transistor, whose channel is connected between the stage output node and the voltage reference node; and
a second transistor, whose channel is connected between the same voltage reference node and the gate of the first transistor.

7. The invention of claim 6, wherein:
one of the first and second transistors is a p-type transistor; and
the other of the first and second transistors is an n-type transistor.

8. The invention of claim 1, wherein the buffer is implemented using CMOS technology.

9. The invention of claim 1, wherein the apparatus is an integrated circuit comprising the buffer.

10. The invention of claim 1, wherein the apparatus comprises an integrated circuit comprising the buffer.

11. The invention of claim 10, wherein the apparatus is a consumer product.

12. An apparatus comprising a buffer having one or more buffer stages connected in series, wherein at least one buffer stage comprises: a stage input node adapted to receive a stage input signal; a stage output node adapted to present a stage output signal; a buffer circuitry connected between the stage input node and the stage output node; and at least one explicit inductor connected between the stage output node and a voltage reference node for the buffer stage, such that the at least one explicit inductor is adapted to reduce apparent load capacitance of circuitry connected to the stage output node, wherein: the at least one explicit inductor is directly connected to both (1) the stage output node and (2) the voltage reference node for the at least one buffer stage, wherein: the buffer circuitry is an inverter comprising (1) a p-type transistor, whose gate is connected to the stage input node and whose channel is connected between the stage output node and a first voltage reference node for the buffer stage, and (2) an n-type transistor, whose gate is connected to the stage input node and whose channel is connected between the stage output node and a second voltage reference node for the buffer stage; and the at least one explicit inductor comprises: a first inductor comprising (1) a first transistor, whose channel is connected between the stage output node and the first voltage reference node, and (2) a second transistor, whose channel is connected between the first voltage reference node and the gate of the first transistor; and a second inductor comprising (1) a third transistor, whose channel is connected between the stage output node and the second voltage reference node, and (2) a fourth transistor, whose channel is connected between the second voltage reference node and the gate of the third transistor.

13. The invention of claim 12, wherein the buffer comprises two or more instances of the at least one buffer stage connected in series to form a multi-stage buffer circuit.

14. The invention of claim 12, wherein the buffer circuit comprises one or more instances of the buffer circuitry connected with the at least one buffer stage to form a multi-stage buffer circuit.

15. The invention of claim 12, wherein the buffer is implemented using CMOS technology.

16. A buffer having one or more buffer stages connected in series, wherein at least one buffer stage comprises: a stage input node adapted to receive a stage input signal; a stage output node adapted to present a stage output signal; a buffer circuitry connected between the stage input node and the stage output node; and at least one explicit inductor connected between the stage output node and a voltage reference node for the buffer stage, such that the at least one explicit inductor is adapted to reduce apparent load capacitance of circuitry connected to the stage output node, wherein: the at least one explicit inductor is directly connected to both (1) the stage output node and (2) the voltage reference node for the at least one buffer stage, wherein the at least one explicit inductor comprises: a first inductor connected between the stage output node and a first voltage reference node; and a second inductor connected between the stage output node and a second voltage reference node.

17. The invention of claim 16, wherein the buffer circuitry is an inverter.

18. The invention of claim 16, wherein the buffer comprises two or more instances of the at least one buffer stage connected in series to form a multi-stage buffer circuit.

19. The invention of claim 16, wherein the buffer comprises one or more instances of the buffer circuitry connected in series with the at least one buffer stage to form a multi-stage buffer circuit.

20. The invention of claim 16, wherein the at least one inductor comprises:
a first transistor, whose channel is connected between the stage output node and the voltage reference node; and
a second transistor, whose channel is connected between the same voltage reference node and the gate of the first transistor.

21. A buffer having one or more buffer stages connected in series, wherein at least one buffer stage comprises: a stage input node adapted to receive a stage input signal; a stage output node adapted to present a stage output signal; a buffer circuitry connected between the stage input node and the stage output node; and at least one explicit inductor connected between the stage output node and a voltage reference node for the buffer stage, such that the at least one explicit inductor is adapted to reduce apparent load capacitance of circuitry connected to the stage output node, wherein: the at least one explicit inductor is directly connected to both (1) the stage output node and (2) the voltage reference node for the at least one buffer stage, wherein: the buffer circuitry is an inverter comprising (1) a p-type transistor, whose gate is connected to the stage input node and whose channel is connected between the stage output node and a first voltage reference node for the buffer stage, and (2) an n-type transistor, whose gate is connected to the stage input node and whose channel is connected between the stage output node and a second voltage reference node for the buffer stage; and the at least one explicit inductor comprises: a first inductor comprising (1) a first transistor, whose channel is connected between the stage output node and the first voltage reference node, and (2) a second transistor, whose channel is connected between the first voltage reference node and the gate of the first transistor; and a second inductor comprising (1) a third transistor, whose channel is connected between the stage output node and the second voltage reference node, and (2) a fourth transistor, whose channel is connected between the second voltage reference node and the gate of the third transistor.

22. The invention of claim 3, wherein the at least one inductor is connected in parallel to the p-type transistor or the n-type transistor.

23. The invention of claim 6, wherein the gate of the second transistor is connected to a second voltage reference node that is different from the voltage reference node.

24. The invention of claim 23, wherein the second transistor operates in a triode region.

25. The invention of claim 1, wherein a substantially constant reference voltage is applied to the at least one buffer stage at the voltage reference node.

26. The invention of claim 17, wherein:
the buffer circuitry is an inverter comprising (i) a p-type transistor, whose gate is connected to the stage input node and whose channel is connected between the stage output node and a first voltage reference node for the buffer stage, and (ii) an n-type transistor, whose gate is connected to the stage input node and whose channel is connected between the stage output node and a second voltage reference node for the buffer stage; and
the at least one inductor is connected in parallel to the p-type transistor or the n-type transistor.

27. The invention of claim 20, wherein the gate of the second transistor is connected to a second voltage reference node that is different from the voltage reference node.

28. The invention of claim 27, wherein the second transistor operates in a triode region.

29. The invention of claim 16, wherein a substantially constant reference voltage is applied to the at least one buffer stage at the voltage reference node.

30. The invention of claim 1, wherein the at least one inductor is an active inductor that comprises at least one transistor.

31. The invention of claim 16, wherein the at least one inductor is an active inductor that comprises at least one transistor.

32. The invention of claim 1, wherein there are no intervening discrete elements connected between the at least one inductor and both (1) the stage output node and (2) the voltage reference node.

33. The invention of claim 16, wherein there are no intervening discrete elements connected between the at least one inductor and both (1) the stage output node and (2) the voltage reference node.

34. The invention of claim 1, wherein: the first inductor is directly connected to both (1) the stage output node and (2) the first voltage reference node; and the second inductor is directly connected to both (1) the stage output node and (2) the second voltage reference node.

35. The invention of claim 34, wherein:
there are no intervening discrete elements connected between the first inductor and both (1) the stage output node and (2) the first voltage reference node; and
there are no intervening discrete elements connected between the second inductor and both (1) the stage output node and (2) the second voltage reference node.

36. The invention of claim 3, wherein:
the at least one explicit inductor comprises first and second inductors;
the first inductor is connected in parallel to the p-type transistor; and
the second inductor is connected in parallel to the n-type transistor.

37. The invention of claim 6, wherein:
the first transistor is directly connected to both (1) the stage output node and (2) the voltage reference node; and
the second transistor is directly connected to both (1) the voltage reference node and (2) the gate of the first transistor.

38. The invention of claim 37, wherein:
there are no intervening discrete elements connected between the first transistor and both (1) the stage output node and (2) the voltage reference node; and
there are no intervening discrete elements connected between the second transistor and both (1) the voltage reference node and (2) the gate of the first transistor.

39. The invention of claim 16, wherein: the first inductor is directly connected to both (1) the stage output node and (2) the first voltage reference node; and the second inductor is directly connected to both (1) the stage output node and (2) the second voltage reference node.

40. The invention of claim 39, wherein:
there are no intervening discrete elements connected between the first inductor and both (1) the stage output node and (2) the first voltage reference node; and
there are no intervening discrete elements connected between the second inductor and both (1) the stage output node and (2) the second voltage reference node.

41. The invention of claim 16, wherein:

the buffer circuitry is an inverter comprising (i) a p-type transistor, whose gate is connected to the stage input node and whose channel is connected between the stage output node and a first voltage reference node for the buffer stage, and (ii) an n-type transistor, whose gate is connected to the stage input node and whose channel is connected between the stage output node and a second voltage reference node for the buffer stage; and the at least one explicit inductor comprises first and second inductors, wherein:

the first inductor is connected in parallel to the p-type transistor; and the second inductor is connected in parallel to the n-type transistor.

42. The invention of claim 20, wherein:

the first transistor is directly connected to both (1) the stage output node and (2) the voltage reference node; and the second transistor is directly connected to (1) the voltage reference node, (2) the gate of the first transistor, and (3) the second voltage reference node.

43. The invention of claim 42, wherein:

there are no intervening discrete elements connected between the first transistor and both (1) the stage output node and (2) the voltage reference node; and there are no intervening discrete elements connected between the second transistor and both (1) the voltage reference node and (2) the gate of the first transistor.

* * * * *